United States Patent [19]

Petersen

[11] 4,033,566

[45] July 5, 1977

[54] PNEUMATIC LINEAR SPRING DEVICE

[75] Inventor: Niel R. Petersen, Hopkins, Minn.

[73] Assignee: MTS Systems Corporation, Eden Prairie, Minn.

[22] Filed: Apr. 26, 1976

[21] Appl. No.: 680,582

[52] U.S. Cl. .................................... 267/126; 52/1; 188/1 B; 248/358 R; 267/136
[51] Int. Cl.² .................... F16F 7/10; F16F 9/00
[58] Field of Search .............. 267/65 R, 113, 115, 267/116, 118, 124, 126, 136, 139; 52/1, 167; 174/42; 188/1 B, 303; 248/18, 20, 358 R, 358 AA

[56] References Cited

UNITED STATES PATENTS

| | | | |
|---|---|---|---|
| 2,312,718 | 3/1943 | Kouyoumjian | 267/126 |
| 3,259,212 | 7/1966 | Nishioka et al. | 174/42 X |
| 3,382,629 | 5/1968 | Reutlinger | 52/1 |
| 3,643,934 | 2/1972 | Bordes | 267/155 |
| 3,726,986 | 4/1973 | Higaki et al. | 248/358 R X |
| 3,911,199 | 10/1975 | Fischer | 188/1 B X |

Primary Examiner—Johnny D. Cherry
Attorney, Agent, or Firm—Dugger, Johnson & Westman

[57] ABSTRACT

A linear spring system using pneumatic cylinders arranged to give a substantially linear force versus displacement curve across a wide range of displacement and which is capable of providing large forces with mechanism.

6 Claims, 4 Drawing Figures

PNEUMATIC LINEAR SPRING DEVICE

BACKGROUND OF THE INVENTION

1. Field of the Invention

The present invention relates to pneumatic springs used for devices where large displacements are necessary, and which can be linearized.

2. Prior Art

In the prior art, pneumatic linear springs have been used, but obtaining linearity across a wide range of travel has been generally difficult, if not impossible.

Prior art devices which superficially resemble the present invention, but which fail to disclose the concept, include U.S. Pat. No. 3,368,499 which shows a collapsible hitch for semitrailers that are mounted on rail cars. A pair of hydraulic cylinders are mounted in this device in opposed relationship (connected rod to rod) in a toggle, and the cylinders collapse toward a horizontal position when not in use. However, use as a spring is not shown in this patent.

Additionally, U.S. Pat. No. 2,327,021 shows a cable tension regulator which has a pair of coil springs arranged at oblique angles to a center connecting member, which in turn is actuated by a hydraulic cylinder. This patent indicates that the load on the central piston remains substantially the same at all times because the springs will change in position as they compress.

Various devices also use shock absorbers in earthquake restraints. U.S. Pat. No. 3,794,277 is such a device, showing angular positioning of shock absorber devices, and U.S. Pat. No. 1,680,890 in FIG. 6 illustrates mechanical links that operate on a fluid pressure cylinder.

Other examples of the prior art include the following U.S. Pat. Nos. 3,171,643, 3,854,706, 3,870,130, 3,876,192, 2,621,036, 3,044,292, 3,022,587.

SUMMARY OF THE INVENTION

The present invention relates to linear springs capable of storing very large amounts of energy over a substantial length of stroke. The linear spring comprises a pair of pneumatic cylinders, in the disclosed form of the invention, and eliminates some of the problems present in other types of springs that have been used for long stroke, large force purposes in the past.

For example, torsion bars store large amounts of energy, but cost too much and take up too much room. Ordinary coil springs, which have sufficient energy storage capacity for the loads envisioned are exceedingly large, and do not load well in both tension and compression. Materials such as Lycra lose too much energy per cycle to be effective, and pendulum concepts are difficult to adjust as to a natural frequency. Ordinary pneumatic springs are very complex to make linear and are normally too long when designed to accommodate the strokes involved.

The usage primarily envisioned herein contemplates the use of such springs in a "tuned mass damper" used for dampening the effect of wind or other forces on a building that tend to make the building sway.

In order to appreciate the problem, the mass used may be in the range of 300 – 400 tons, and may have the motion of plus or minus 4 to 5 feet, and even more in some instances.

An example where a tuned mass damper system was proposed is in the First National City Bank Building of New York. A concrete block weighing some 400 tons was to be positioned on the 59th floor and the spring force required for the dampener was to be in the range of 147 KIPS.

In such arrangement, suitable linearity was achieved and also the force and displacement parameters were capable of being met by the use of a pair of pneumatic cylinders pivotally connected rod end to rod end and each also pivotally mounted to a support at their base ends. The three pivot axes formed a common plane in a centered position. The pneumatic cylinders were connected to the mass at the common pivot between the rod ends of the cylinders. The mass was mounted for movement along a line normal to the plane defined by the pivot axes of the cylinders. The cylinders were charged with fluid under pressure on the rod side of the pistons so that opposing tension force was exerted on the respective rods, opposing the force of the other cylinder. The mass was suitable mounted for movement on low friction supports, and accumulators were provided to the rod ends of the cylinders. The toggle type arrangement of the mutually opposed actuators operating under tension only provided the necessary force storage for displacements of the mass up to about five feet and a generally linear displacement-force curve.

The pneumatic pressures involved were generally below 2500 psi at peak pressure during travel. The spring arrangement was relatively low in cost and also safe.

DESCRIPTION OF THE PREFERRED EMBODIMENT

First, referring to the schematic representation of a building, the building is represented at 10, and wind load indicated by arrows 11 will cause the building to sway from its center axis indicated at 12 so that it has a mean sway deflection represented by the offset between the center axis 12, which is a perpendicular axis, and the axis passing through the center of the deflected building. The building deflects in both directions from the center line.

Figure 2:
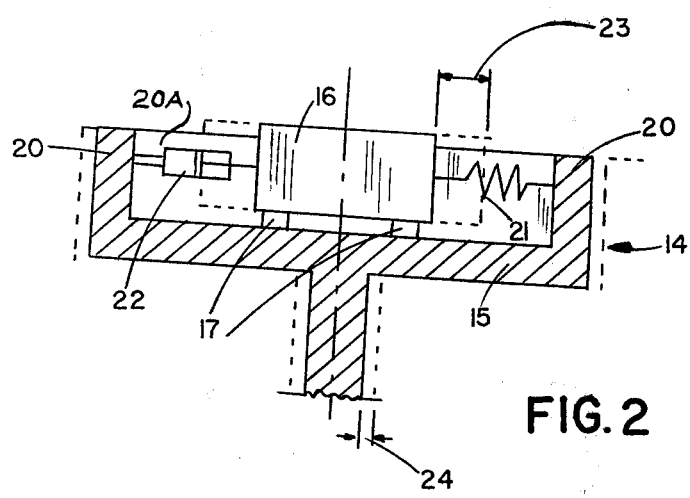
FIG. 2 is an enlarged schematic view of a typical tuned mass damper system used with the linear springs of the present invention.

The damper mass support indicated schematically at 14 is provided at a desired location on the building 10, usually adjacent the top. As can be seen in FIG. 2, and as schematically represented, the mass damper system 14 includes a support platform 15, a mass block 16, and suitable support means 17 for permitting the mass block to move along the surface of the support platform 15. Such supports 17 may be pressure balance hydrostatic bearings such as those shown in U.S. Pat. No. 3,921,286. The hydrostatic bearings permit the mass block 16 to be supported for movement laterally relative to the support platform 15 with very little friction loading.

It should be noted that the form shown is only for biaxial movement for simplicity of explanation. Suitable means can be provided so that the mass block 16 will also slide in directions at right angles to the direction shown.

Figure 1:
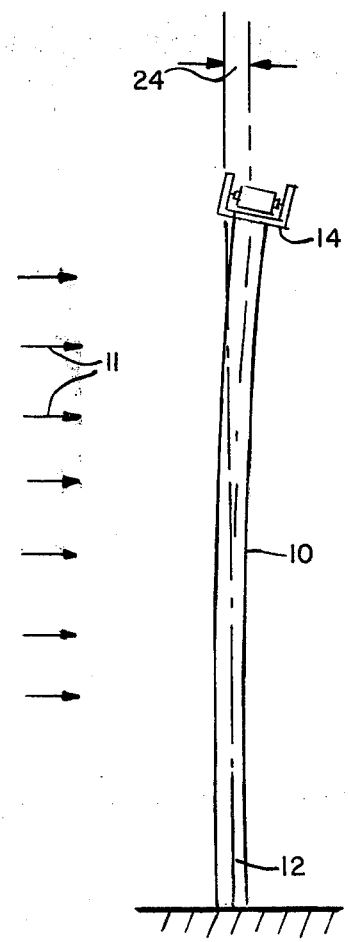
FIG. 1 is a schematic representation of a building having a tuned mass damper system shown at the upper end of the building.

The support platform 15 includes upright restraining members 20 on opposite sides thereof, and the spring represented at 21 is used between one of the supports 20 and the mass block, while a dampener of conventional design indicated generally at 22 is used between the other support 20 and the mass block. The dampener can be a hydraulic shock absorber, that is, a hydraulic cylinder with a bleed hole in the piston. The maximum permissible displacement of the mass block from its center position is represented by the double arrow 23. It can be seen that the dynamic mean deflection of the building, which is indicated at 24 between the two upright axes lines in FIG. 1 and also shown in FIG. 2, must be less than the maximum dynamic deflection indicated by the double arrow 23 so that the mass block can deflect more than the building.

The tuned mass damper systems are made so that they will dampen the movement of the building with suitable efficiency, and again the problem has been in obtaining springs represented at 21 which can be used within the space allocated, and which will have linearity across the range of deflection necessary, which is in the range of plus or minus 4 to 6 feet and yet be reasonable in cost.

Figure 3:
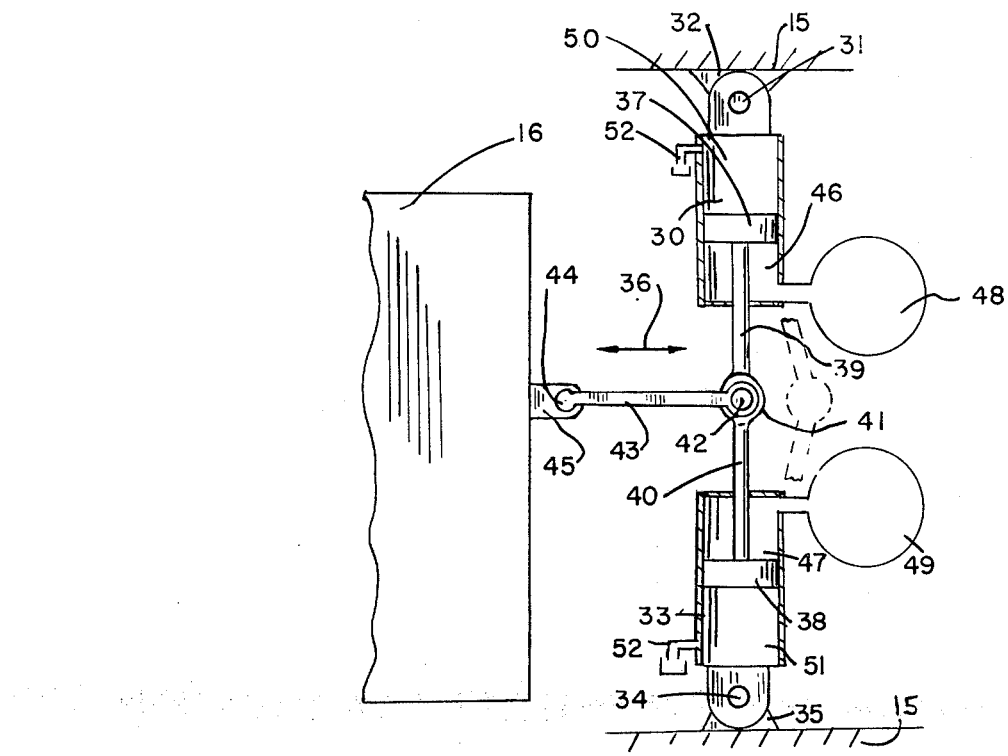
FIG. 3 is a schematic representation of the pneumatic cylinders arranged in their toggle arrangement to act as springs.

Represented in FIG. 3 is a schematic representation of a spring arrangement made according to the present invention. As shown, a first pneumatic cylinder 30 is pivotally mounted as at 31 to a support 32 that is fixed with respect to the support 15. The second pneumatic cylinder 33 is pivotally mounted at its base end as at 34 to a support 35 that is also fixed to the support 15 on an opposite side thereof. In the form shown, the supports 32 and 35 would be on a rear upright wall 20A shown in FIG. 2, and a front wall which is not shown. The spring force direction is indicated by the arrow 36. As can be seen, the cylinders 30 and 33 each have an internal piston 37 and 38, respectively, and each of the pistons has a rod 39 and 40, respectively. The piston rods have rod ends indicated schematically at 41, which are pivotally mounted on a common pivot connection 42. The rods are supported for sliding movement where they pass out of the cylinder, and thus the assemblies form rigid, telescoping links between the pivots at the base ends of the cylinders and the pivot 42 connecting the rods together.

The axes of pivots 31, 34 and 42 lie on a common plane with the spring arrangement in a centered or rest position as shown.

The connecting link 43 is mounted to the same pivot as pivot 42, and is connected to this pivot through a spherical ball connection for universal movement to prevent binding of the link. The connecting rod or link 43 in turn is pivotally connected through a universal pivot connection as at 44 to a bracket 45 on the mass block 16. While no guiding means for the mass block is shown, the mass block may be guided in a desired path of movement at right angles to the cylinder axis.

The cylinders 30 and 33, as shown, each have a first chamber 46 and 47, respectively, at the rod ends of the cylinders and these chambers are open to fluid pressure accumulators 48 and 49, respectively. The base ends of the cylinders form chambers 50 and 51, respectively, (on opposite sides of the piston from chambers 46 and 47) which chambers 50 and 51 are vented through suitable vents indicated at 52 to atmosphere.

The accumulators 48 and 49 are charged so that the chambers 46 and 47 are also under the desired pressure and thus the rods 39 and 40 are forced in directions opposite from each other and are tension loaded against each other. The plane of the axis of pivots 31, 34 and 42 (the centered reference plane) is at right angles or normal to the desired direction of movement of the mass 16 as represented by the arrow 36. Thus the cylinders form a more or less toggle linkage with the connecting rod 43 in the center connection.

As the building sways, the support will tend to move relative to the mass, which tends to remain in one position. This relative movement moves the pivot connection 42 out of the reference plane. Movement of the pivot 42 out of the reference plane results in extension of both rods 39 and 40, thereby compressing the fluid in chambers 46 and 47 and in the accumulators. Compression occurs from such movement in either direction from the centered position. The fluid pressure creates a force tending to restore the cylinders to their centered position, thus acting as springs.

The accumulators are selected in size so that the pressure in the cylinder does not increase excessively during a stroke, but does increase as the pivot 42 moves from the reference plane. Thus the force exerted tending to resist movement of the mass block increases as the deflection increases.

Figure 4:
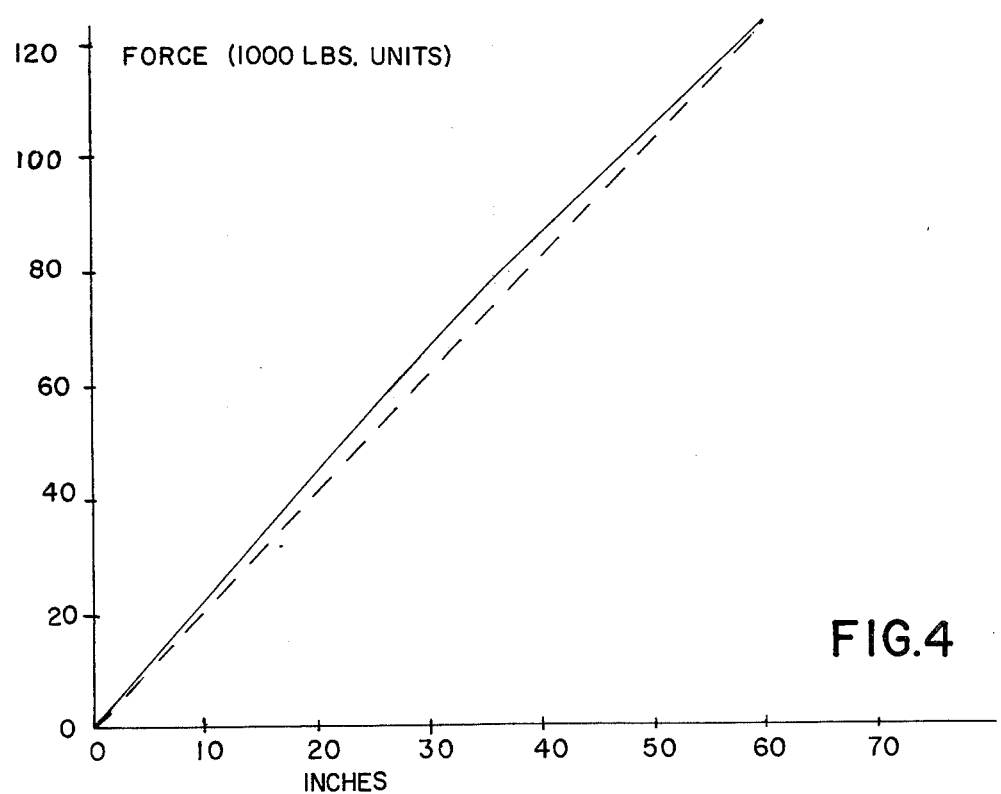
FIG. 4 is a typical load versus deflection curve of the arrangement shown in FIG. 3.

FIG. 4 shows a representation of a typical spring deflection-force curve for adiabatic compression of the spring arrangement shown in FIG. 3. Deflection is up to 60 inches, and the force ranges up to approximately 120,000 pounds. A straight line (linear response) is shown in dashed lines, and an actual restoring force achieved by a typical cylinder arrangement of FIG. 3 is illustrated in solid lines.

In the form shown the adiabatic compression parameters required the active area of the pistons on the rod side to be approximately 35 square inches; the volume in each accumulator and connected chamber 46 or 47 to be approximately 6,400 cubic inches, and the initial pressure to be approximately 1250 psi for a precharge gas with an adiabatic compression coefficient of $\gamma = 1.4$. The length of each of the cylinders between the axis of the base ends 31 and 34 to the pivot axis 42 between the rods, at centered position was approximately 42 inches.

Thus standard cylinders can be used, without any special adaptation. These cylinders are supported in a common horizontal plane, with the pivot axes 31 and 34 lying in a vertical plane at right angles to the desired direction of movement.

The effective spring rate can be varied by changing the initial charge pressure, as well as changing the sizes of the pistons and the length of the cylinder at rest position. Both cylinders are supplied with equal pressure and thus exert equal, opposed tension forces on the center connection with the force being at right angles to the direction of motion of the mass.

The rods 39 and 40 each have a separate rod end 41 so that they pivot relative to each other and while a dotted line position is shown in FIG. 3 to one side, it is to be understood that rod ends 41 move in both directions from the reference plane. The unit acts alike in either direction and thus accommodates tension and compression loading.

The configuration described above can also be used to linearize pneumatic springs which are so slowly operated that they become essentially isothermal. Minor changes in the geometry, the auxiliary gas volume and the piston area allow the linearized device to be operational over a wide range of apparent adiabatic gas compression coefficients.

What is claimed is:

1. A pneumatic linear spring for use under high loads and with substantial travel comprising first and second pneumatic motor means, accumulator means to provide fluid under pressure to said motor means, a first object, a second object mounted to be movable relative to said first object in a first direction and which movement is to be subjected to spring forces, means to mount said first and second motor means relative to a first of said objects, said motor means including link means connected between said first and second motor means and loaded in tension by both of said motor means and being urged to move to a rest position, said link means having a central pivot between said motor means and being mounted with respect to the motor means and the first object to permit folding movement of said link means in said first direction from the rest position to increase the fluid pressure acting upon both of said motor means to increase tension loading from both of said motor means tending to restore the link means to said rest position, and means to couple said second object to said link means to cause said link means to move to folded position in said first direction when said second object moves in said first direction relative to the first object.

2. A spring device utilizing fluid power cylinder-piston and rod assemblies for resisting movement of a first object relative to a second object, said assemblies having a body member and a rod member slidable relative to said body member and each forming a link having first and second ends, means to pivotally mount the first ends of each of said assemblies to said first object, means to pivotally mount the second ends of each of said assemblies together about a common pivot, means to supply fluid under pressure to said assemblies to load the rod of one assembly against the rod of the other at said pivot whereby said assemblies move to a rest position with the common pivot lying along a plane defined by the pivots of the first ends of said assemblies, and means to connect said second object to said common pivot whereby translation of said second object tends to move said common pivot out of said plane.

3. The combination as specified in claim 2 wherein said assmeblies each comprise a linear actuated piston and rod movable in a cylinder, which form a rigid, but telescoping assembly between the ends thereof.

4. Th combination as specified in claim 3 wherein means to supply fluid under pressure provides gaseous pressure and the telescoping movement of said assemblies from rest position is resisted by increasing pressure exerting a force on each of said assemblies tending to shorten the length of the assemblies.

5. In a mass-dampener system including a weight movable relative to a supporting structure, means comprising energy storage springs for storing energy generated by movement of said weight relative to said structure including a pair of piston and cylinder assemblies, each of said assemblies comprising a movable piston inside a cylinder, link means between said pistons comprising tension carrying rods pivotally mounted to each other substantially midway between said cylinders and resisting tension from the other rod, means to pivotally mount opposite ends of said cylinder assemblies to said structure, means to provide fluid under pressure on said pistons to create a tension in said rods, means to connect said weight to the pivot between said rods whereby movement of said weight relative to said structure will cause said cylinder assemblies to pivot on their mountings to said structure and the pivot between said rods to move to increase the tension on said rods as said weight moves.

6. The combination as specified in claim 5 wherein said means to supply fluid under pressure comprises pneumatic pressure accumulator means on a side thereof creating tension forces on said rod.

* * * * *